United States Patent [19]
Huijsing et al.

[11] Patent Number: 6,118,341
[45] Date of Patent: Sep. 12, 2000

[54] DEVICE WITH COMMON MODE FEEDBACK FOR A DIFFERENTIAL OUTPUT

[75] Inventors: Johan H. Huijsing, Schipluiden, Netherlands; Behzad Shahi, San Jose, Calif.

[73] Assignee: Philips Electronics North America Corporation, New York, N.Y.

[21] Appl. No.: 09/184,528

[22] Filed: Nov. 2, 1998

[51] Int. Cl.[7] .................................................... H03F 3/45
[52] U.S. Cl. .......................................... 330/258; 330/253
[58] Field of Search ................................... 330/253, 258, 330/259

[56] References Cited

U.S. PATENT DOCUMENTS

| | | | |
|---|---|---|---|
| 5,578,964 | 11/1996 | Kim et al. | 330/258 |
| 5,604,464 | 2/1997 | Hwang et al. | 330/258 |
| 5,729,178 | 3/1998 | Park et al. | 330/258 |

*Primary Examiner*—Robert Pascal
*Assistant Examiner*—Khanh Van Nguyen
*Attorney, Agent, or Firm*—Brian J. Wieghaus

[57] ABSTRACT

A functional circuit such as an OP-amp has a differential output. A common mode signal at the differential output is adjusted by means of a common mode feedback circuit coupled between the differential output and the common mode adjustment input. The common mode feedback circuit contains IGFETs, each having a channel and a backgate, each connection of the differential output being coupled to the backgate of a respective one of the IGFETS. Thus the voltages at the outputs influence the current through the channel. The sum of the currents determines a feedback to the common mode control input.

7 Claims, 8 Drawing Sheets

DEVICE WITH COMMON MODE FEEDBACK FOR A DIFFERENTIAL OUTPUT

FIELD OF THE INVENTION

The invention relates to a device containing a functional circuit with a differential output.

BACKGROUND ART

Page 287 to 291 of a book titled "Analog Integrated Circuits" by David Ajohns and Ken Martin and published by John Wiley and Sons in 1997, describe an op-amp that has a differential output and a common mode feedback circuit for controlling the common mode of the potentials of the differential outputs.

A circuit with a differential output, for example an op amp, delivers its output signal as the difference between the potentials or currents on two output connections. In contrast a circuit with a single ended output delivers its output as a potential relative to a supply connection. In comparison to a circuit with a single ended output, a circuit with a differential output provides improved substrate and supply noise rejection, added dynamic range and systematic offset cancellation or reduction.

The common mode potential of the differential output, that is, the average of the potentials on the two output connections has no significance for the output signal. However, to ensure proper operation of the circuit, the common mode potential should be kept near some set potential. A common mode feedback circuit is commonly used to regulate the common mode of the differential output.

Johns and Martin disclose a common mode feedback circuit comprising two differential pairs, each containing a current source and a first and second IGFET, the gate of the first IGFET in each pair being coupled to a respective one of the connections of the differential output, the gate of the second mosfet being coupled to a reference potential. (IGFETs:

Insulating Gate Field Effect Transistors are also commonly referred to as MOSFETs: Metal Oxide Silicon Field transistors, which is taken to include FETS with any kind of gate electrodes, also poly-silicon gate electrodes). The outputs of the differential pairs are combined so that a current proportional to the difference between the reference potential and the common mode potential is produced. This current is used as a feedback to control the common mode of the differential output.

This common mode feedback circuit operates properly only as long as the potentials of the connections of the differential output are within the operating range of the differential pairs, that is, more than a IGFET threshold plus a current source saturation voltage away from a power supply potential. Typically this means that 1.2 Volt of the potential range between the power supply potentials cannot be used for the potentials at the differential output. For circuits with a low power supply range this is a significant limitation.

SUMMARY OF THE INVENTION

Amongst others, it is an object of the invention to make it possible to increase the range over which the potentials at the differential output may vary.

According to the invention the common mode feedback circuit comprises IGFETS, the connections of the differential output being coupled to the backgate so as to have an influence on current through the channel dependent on the common mode the sum of the influences is used to feedback the common mode to the common mode control input.

When a varying potential is applied to the backgate, the IGFETs remains operational over a wider range than when that potential is applied to the gate of an IGFET. Hence, the common mode feedback circuit is operational over a wider range.

Preferably, the gate of the IGFET is connected to one of the power supply connections, so that the IGFET is operational over as large a range of potentials as possible.

In an embodiment of the device according to the invention, the currents through the IGFETs are summed and used to determine a current supplied to the common mode adjustment input of the functional circuit, for example using current mirror techniques and/or by providing a current path from the channels of the IGFETs to the adjustment input. Thus, changes in the sum of the current lead to adjustment of the common mode voltage.

It is possible that the common mode feedback exhibits a residual dependence on the differential output voltage. In case this is a problem, the residual dependence may be reduced by using additional IGFETs with their backgates coupled to the connections of the differential output, so that the common mode potential has a further influence on the current through their channels, in such a way that the current through the additional IGFETs has a compensating effect on the residual effect of the earlier mentioned IGFETs.

These and other advantageous aspects of the invention will be described by way of non-limitative examples using the following figures.

Figure 1:
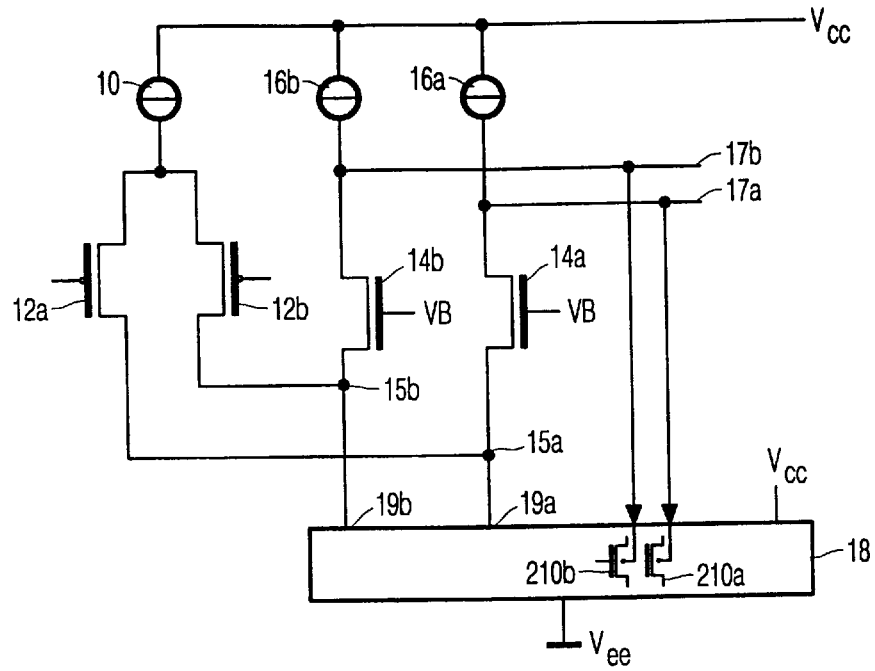
FIG. 1 shows an op-amp with a differential output and a common mode feedback circuit

FIG. 1 shows an example of an op-amp with a differential output and a common mode feedback circuit. The circuit has supply connections Vcc and Vee. The op-amp contains a differential pair containing a first and second PMOS transistors 12a,b with common source connections and a current source 10 connected between the common source connections and the Vcc supply connection. The op-amp contains a first and second current folding branch connected between the supply connections Vee and Vcc and each containing successively a node 15a,b, a channel of an NMOS transistor 14a,b, connection of the differential output 17a,b, a current source 16a,b and the power supply connection Vcc. The drains of the first and second current source are each connected to nodes 15a,b of a respective one of the two current folding branches. The gates of the first and second NMOS transistor are connected to a bias voltage connection VB.

A common mode feedback circuit 18 is connected between the connections 17a,b of the differential output and the current folding branches. The control circuit has inputs coupled to the differential output connections 17a,b. The common mode feedback circuit has controllable current sources outputs 19a,b. The controllable current source outputs 19a,b are each also part of a respective one of the current folding branches, each connected to a respective one of the nodes 15a,b so as to supply a current with a high impedance.

Inside the common mode feedback circuit 18 MOS transistors 210a,b are shown. The connections 17a,b of the differential output are each connected to the backgate of a respective one of the MOS transistors 210a,b. Further circuitry (not shown in FIG. 1) couples the MOS transistors 210a,b to the controllable current source outputs 19a,b.

In operation, input potentials are applied to the gates of the PMOS transistors 12a,b in the differential pair. The input potentials control PMOS the distribution of the current from the current source 10 of the differential pair over the PMOS transistors.

The fold-back branches serve to pass this distribution to the connections 17a,b of the differential output. Equal currents are supplied to the current folding branches by the current sources 16a,b and the controllable current outputs 19a,b. As a result the difference between currents supplied by the PMOS transistors 12a,b in the differential pair determines the difference between the currents at the connections 17a,b of the differential output. The first and second NMOS transistor 14a,b serve as a cascode to isolate the nodes 15a,b from potential changes at the connections 17a,b of the differential output.

The common mode feedback circuit 18 serves to keep the common mode potential of the connections 17a,b (half their sum) substantially at a predetermined potential. For this purpose the common mode feedback circuit 18 senses the difference between a reference potential and the common mode of the potentials of the connections 17,b of the differential outputs. The common mode feedback circuit 18 adjusts the currents through the connections 17a,b of the differential output in proportion to that difference. This results in a negative feedback loop, which keeps the common mode of the differential output substantially at the reference potential.

In the particular circuit of FIG. 1, the common mode feedback circuit 18 adjusts the current through the connections 17a,b of the differential output via the current foldback branches. Because current sources are connected at all terminals of the current foldback branches, the current supplied by the common mode feedback circuit 18 has to flow to the connections 17a,b of the differential output. The common mode feedback circuit 18 is arranged so that it supplies the same current from both controllable current source outputs 19a,b.

When the common mode potential of the differential output is equal to a desired reference potential, the common mode feedback circuit 18 ensures that there is substantially no net common mode current at the differential output. That is, it ensures that in that case the current outputs 19a,b supply "quiescent" currents whose sum is substantially equal to the sum of the currents from the current source 10 of the differential pair and the current sources 16a,b of the current foldback branches. When the common mode potential of the differential output deviates from the desired potential, the currents from the current outputs 19a,b are varied in proportion to the deviation.

The invention is not limited to the particular configuration shown in FIG. 1. For example Any path for connecting the drains of the transistors of the differential pair to the differential output may be used. For example, one might omit the current foldback branches and take the output directly from the drains of the transistors 12a,b in the differential pair. Instead of the differential pair, more elaborate input circuits may be used. The circuit need not even be a differential amplifier, any circuit with a differential output will do. The essential point is that a common mode feedback circuit is included which regulates the common mode component of the signal at the output of the circuit.

It is important that the common mode feedback circuit 18 keeps operating when the potentials of the connections of the differential output vary over a wide range. For this reason, the potential of the connections 17a,b of the differential output influence the common mode feedback circuit 18 via the back-gate of MOS transistors 210a,b. Via the back gate, the potential of the connections 17a,b of the differential output influence the current flowing through the channel of the MOS transistors 210a,b and/or the voltage across the channel and this current and/or voltage is used to control adjustment of the currents supplied by the controllable differential current source output.

By using the back-gate for this purpose a wide operating range is obtained; the only condition on the operating range is that the junction diodes from the source and drain to the back-gate are kept out of conduction. In case of a PMOS transistor 210a,b this means that the backgate potential must remain above than a potential approximately 500 mV below the highest of the source/drain potentials. Hence if these source drain potentials are kept near Vee, the common mode feedback circuit 18 can handle potentials of the connections 17a,b of the differential output over nearly the entire supply voltage range. (Similarly, in case of NMOS transistors 210a,b the potential should be below a potential approximately 500 mV above the lowest of the source drain voltages and if these source drain voltages are kept near Vcc a wide operating range is realized).

Various circuits may be used to control the currents through the controllable current outputs 19a,b as a function of the current and/or voltage across the MOS transistors 210a,b. In the following a number of such circuits will be disclosed.

Figure 2:
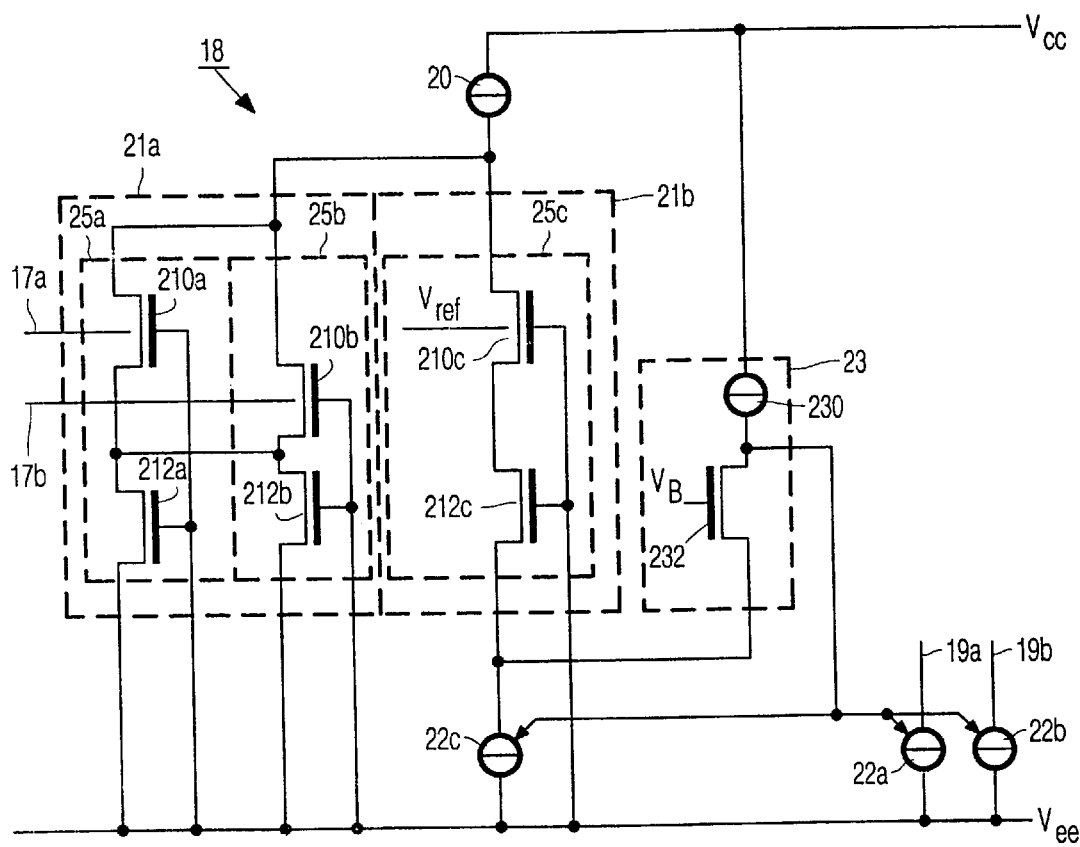
FIG. 2 shows a first embodiment of a common mode feedback circuit

FIG. 2 shows a first embodiment of the common mode feedback circuit 18 according to the invention. The common mode feedback circuit of FIG. 2 contains a sensing circuit 20, 21a,b, a current control circuit 23 and identical first, second and third controllable current source 22a–c. The first and second controllable current source 22a,b have outputs connected to the first and second current source output 19a,b respectively.

The sensing circuit of FIG. 2 contains a common current source 20 whose outputs forks over a sense branch 21a and a reference branch 21b. The sense branch has an output coupled to the supply voltage connection Vee, the reference branch has an output coupled to an output of the third controllable current source 22c and to the current control circuit 23. The current control circuit has an output coupled to control inputs of the first, second and third controllable current source 22a–c.

The sense branch contains a first and second current branch 25a–b. The reference branch contains a third current branch 25c. Each current branch 25a–c contains a series connection of the channel of a first and second PMOS transistor 210a–c, 212a–c. The gates of the transistors 210a–c, 212a–c are connected to the power supply connection Vee.

The current control circuit 23 contains a current source 230 coupled to the first node via the channel of an NMOS transistor 232. The gate of NMOS transistor 232 is coupled to the bias voltage connection VB. A second node between the current source 230 and the channel of NMOS transistor 232 is coupled to a control input of the first second and third controllable current source 22a–c.

The back-gate of the first PMOS transistors 210a–b in the first and second current branch 25a–c are connected to the first connection 17a of the differential output and the second connection 17b of the differential output. The drains of the first PMOS transistors 210a,b in the first and second current branch 25a–b are mutually connected.

The back-gate of the first PMOS transistor 210c in the reference branch 21b is connected to a reference potential.

In operation it is assumed that the current sources 16a,b in the current fold-back branches of FIG. 1 each supply a current I and that the current source 10 of the differential pair supplies a current 2I. The common current source 20 supplies a current 3I and the current source 230 of the current control circuit 23 supplies a current I. The current through the reference branch 21b will be called Y.

The current control circuit 23 serves to ensure that the currents supplied by the first, second and third controllable current sources 22a–c are each substantially equal to I+Y.

This is achieved because a currents I is supplied to the first node by the current source 230 in the current control circuit 23 and a current Y is supplied by the third current branch 25c. The control voltage of the controllable current sources 22a–c is adjusted by the potential at the second node until this current is balanced by the current from the third controllable current source 22c.

The sum of the currents supplied to nodes 15a,b is now 2I (from the current source 10 of the differential pair) plus 2I (from the current sources 16a,b in the current folding branches) minus 2(I+Y) (from the current source outputs 19a,b of the common mode feedback circuit 18), that is 2(I–Y).

The common mode feedback circuit 18 will regulate the current supplied to the current folding branches until the sum of the currents supplied to the nodes 15a,b is substantially zero, that is, until Y=I. The common mode potential of the connections of the differential output will be steady only when this sum is zero.

At zero differential output voltage, i.e. when the potentials of the connections 17a,b of the differential output are equal, Y=I will occur when the voltages at the connections 17a,b of the differential output and supplied to the back-gate of the first PMOS transistors 210a,b of the first and second current branch 25a,b are regulated so that they equal to the reference voltage supplied to the back gate of the first PMOS transistor 210c in the third current branch.

When the differential output voltage increases from zero, the current through one of the PMOS transistors 210a,b will increase and the current through the other PMOS transistor 210a,b will decrease by nearly the same amount. Consequently, the sum of these two currents will still be nearly the same as for zero differential output voltage and the common mode potential will remain near the reference potential.

Figure 3:
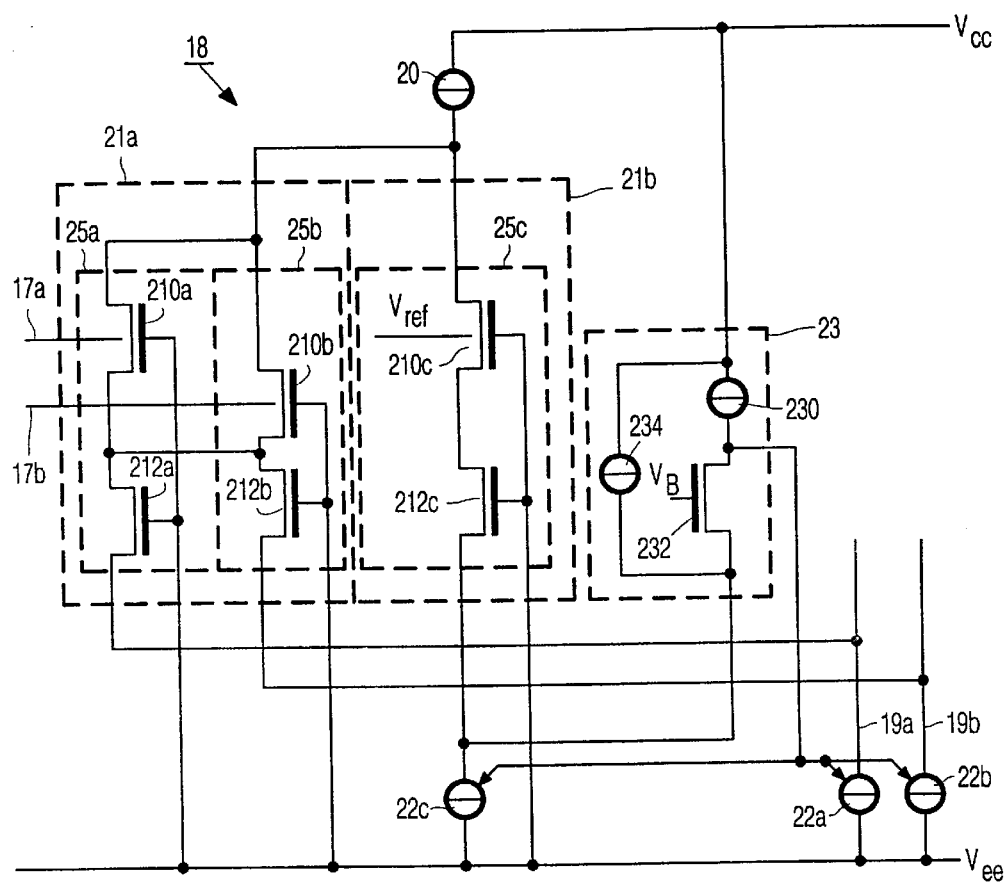
FIG. 3 shows a first alternative for the common mode feedback circuit

FIG. 3 shows a first alternative for the common mode feedback circuit. The difference with the circuit of FIG. 2 is that the first and second current branch are not connected to the supply node Vee, but to the output of the first and second controllable current source 22a,b respectively. Furthermore, the current control circuit 23 contains an additional current source 234 connected to the first node between the reference current branch 21b and the third controllable current source 22c.

In operation of the circuit of FIG. 3, the currents from the first and second current branches 25a,b will contribute to the net current at the outputs 19a,b of the controllable current source. The currents from the first and second current branches 25a,b will be equal, each (3I–Y)/2, because the second PMOS transistors 212a,b in the first and second current branches 21a–b are equal and have equal terminal voltages.

In the steady state (at the desired common mode potential, when Y=I), this will subtract a current I from the net current at each output node 19a,b. To compensate for this, the additional current source 234 supplies a current I in order to force an increase in the output current of the controllable current sources 22a–c by I to 2I+Y.

As a result, the net current at each output node is (I+3Y)/2. The sum of the currents supplied to nodes 15a,b is now 2I (from the current source 10 of the differential pair) plus 2I (from the current sources 16a,b in the current folding branches) minus I+3Y (from the current source outputs 19a,b of the common mode feedback circuit 18), that is 3(I–Y). Again, the common mode feedback circuit will regulate this net current to zero (Y=I) by adjusting the average of the potential of the backgates of transistors 210a,b to the reference voltage.

It will be noted that the circuit of FIG. 3 increases the sensitivity of the net output current at the output node with respect to the current Y in the current branch 25c to 3Y as compared to 2I in FIG. 2.

It will be appreciated that without deviating from the invention numerous variations can be applied to the circuits of FIGS. 2 and 3. For example, the third controllable current source 22c might differ from the first and second controllable current source, so as to create a current amplification (or reduction) factor; a different current might be supplied by the common current source 20, by the current sources 16a,b in the foldback branches, by the current source 10 the differential pair or by the current source or sources in the control circuit. What matters is only the net common mode current supplied to the connections 19a,b of the differential output. This net current should be affected by the common mode potential of these connections 17a,b and the various current sources should be chosen such that their sum gives rise to a net current that is zero when this common mode potential is approximately at the desired common mode potential.

Figure 4:
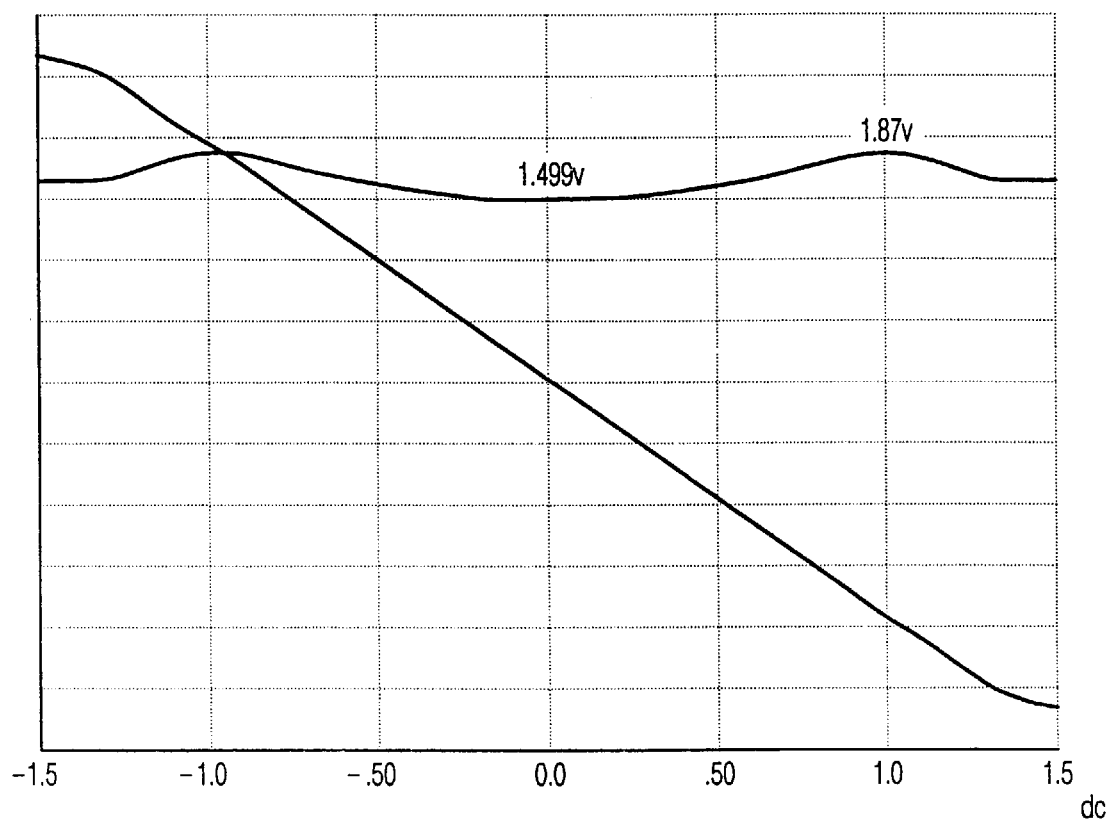
FIG. 4 shows a graph produced by simulation of the circuit of FIG. 1 and 3.

FIG. 4 shows a graph produced by simulation of the circuit of FIG. 1 and 3. The graph depicts the differential output voltage and the common mode output potential as a function of the differential input voltage at the gates of the transistors 12a,b of the differential pair. The common mode output potential is seen to be substantially constant when the differential output voltage range over a wide range. A deviation occurs for larger differential voltage, because in this case the decrease in current in one of the current branches 25a,b does not exactly compensate the increase in current in the other current branch 25a,b do to non-linearity.

Figure 5:
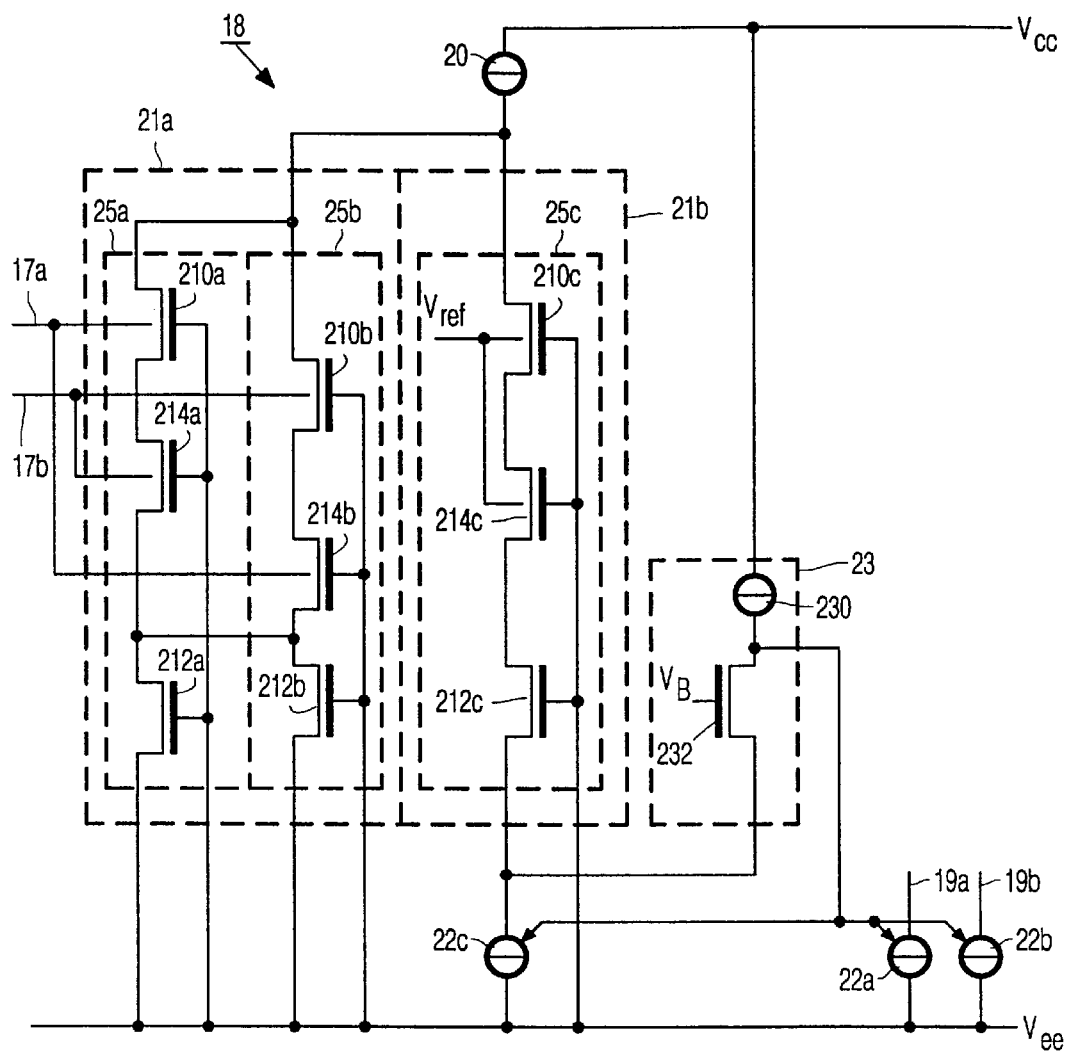
FIG. 5 shows a further embodiment of the common mode feedback circuit.

FIG. 5 shows a farther embodiment of the common mode feedback circuit. In comparison with the circuit of FIG. 2, an additional PMOS transistor 214a–c has been added to each of the current branches 25a–c. The channel of the additional PMOS transistor 214a–c has been inserted between the channels of the first PMOS transistor 210a–c and second PMOS transistor 212a–c.

The back gate of the additional PMOS transistor 214*a–b* in the first and second branch are coupled to the connections 17*a,b* of the differential output, but in each current branch 21 *a–c* to a different one of these connection 17*a,b* than the first PMOS transistor 210*a,b* in the same current branch. The drains of the additional PMOS transistors 214*a,b* in the first and second current branch have been connected; unlike FIG. 4 there is no connection between the drains of the first PMOS transistors 210*a,b* in these current branches 21 a,b.

In the third current branch 21*c* the backgates of both the first transistor 210*c* and the additional transistor 214*c* are coupled to the reference potential.

In the circuit of FIG. 5 instead of the connections similar to those of FIG. 2, the current branches may also be connected as in FIG. 3.

In operation, the common mode feedback circuit 18 of FIG. 5 operates similar to that of FIG. 2 or 3.

Figure 6:
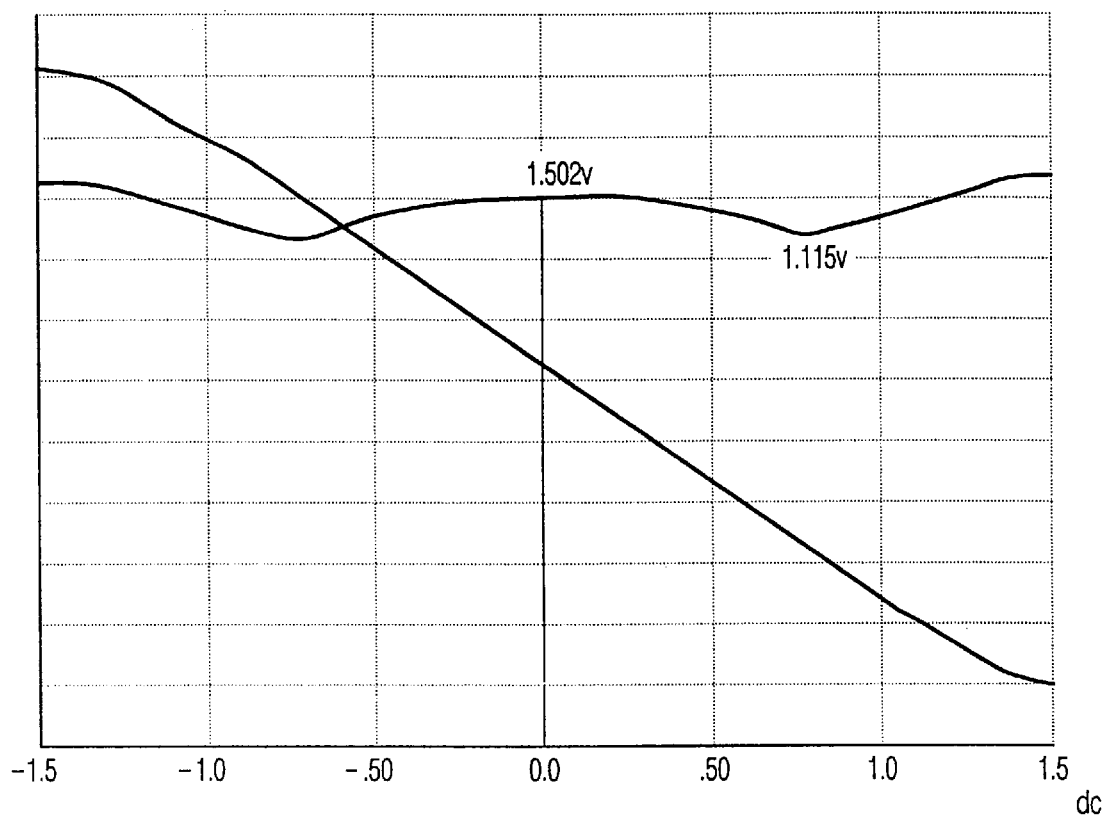
FIG. 6 shows simulations of the circuit of FIG. 5

FIG. 6 shows simulations of the circuit of FIG. 5. It is seen that the slight dependence of the common mode potential on the differential output voltage is different from that of FIG. 3. Instead of a small rise in common mode potential for larger differential output voltages, there is a small drop.

In the circuit of FIG. 5, a connection between the drains of the first PMOS transistors 210*a,b* in the first and second current branch 25*a,b* may be added. It has been found that this connection changes the small drop of FIG. 6 into a small rise.

Two or more sets of current branches 25*a–c*, each with its own common current source 20, may be combined into one common mode feedback circuit 18. In this case the dependencies on the differential output voltage produced by the sets of current branches are added. If dependencies on the differential output voltage are opposite (a rise and a drop respectively) the resulting dependence will be smaller than that of the combined current branches.

Figure 7:
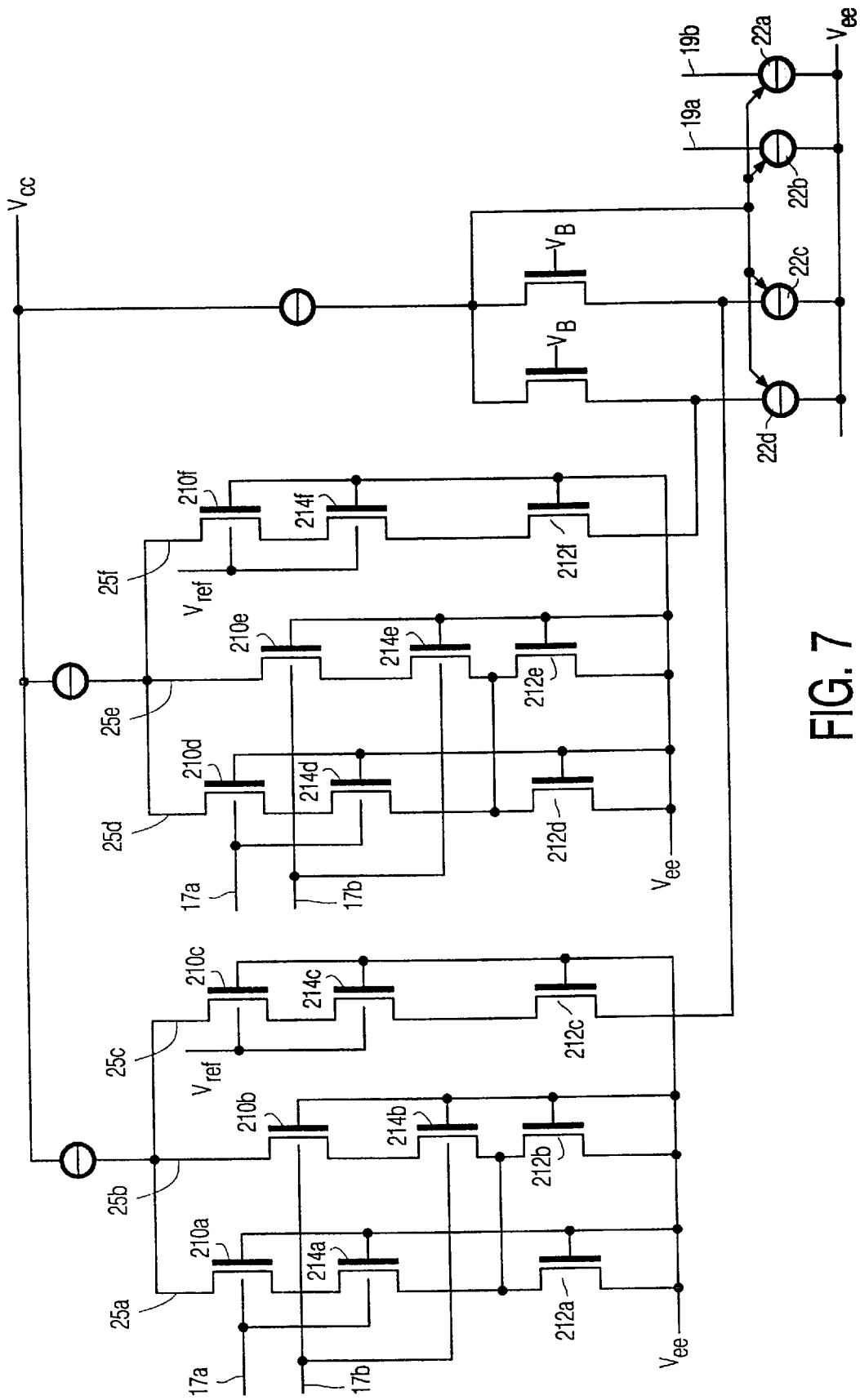
FIG. 7 shows an example of a further common mode feedback circuit

FIG. 7 shows an example of such a common mode feedback circuit 18 which combines two sets of current branches 25*a–f*. Each current branch contains the channels of three PMOS transistors 210*a–f*, 214*a–f* and 212*a–f*. The back gates of the first transistor 210*a–f* and the additional transistor 214*a–f* in each current branch 25*a–f* are connected to each other. In the first current branch of each set these backgates are connected to a first one 17*a* of the connections of the differential output. In the second current branch of each set these backgates are connected to a second one 17*b* of the connections of the differential output. In the third current branch of each set these backgates are connected to a reference potential.

The difference between the two sets 25*a–c*, 25*a–f* lies in the connections between the drains of the PMOS transistors 210*a–f*, 214*a–f* of different current branches 21 *a–f*. In the first set 21 *a–c* only the drains of the first PMOS transistors 210*a,b* of the first two current branches are connected. In the second set 21*d–f* both the drains of the first PMOS transistor 210*d,g* and the drains of the additional PMOS transistor 214*d,g* are mutually connected.

Figure 8:
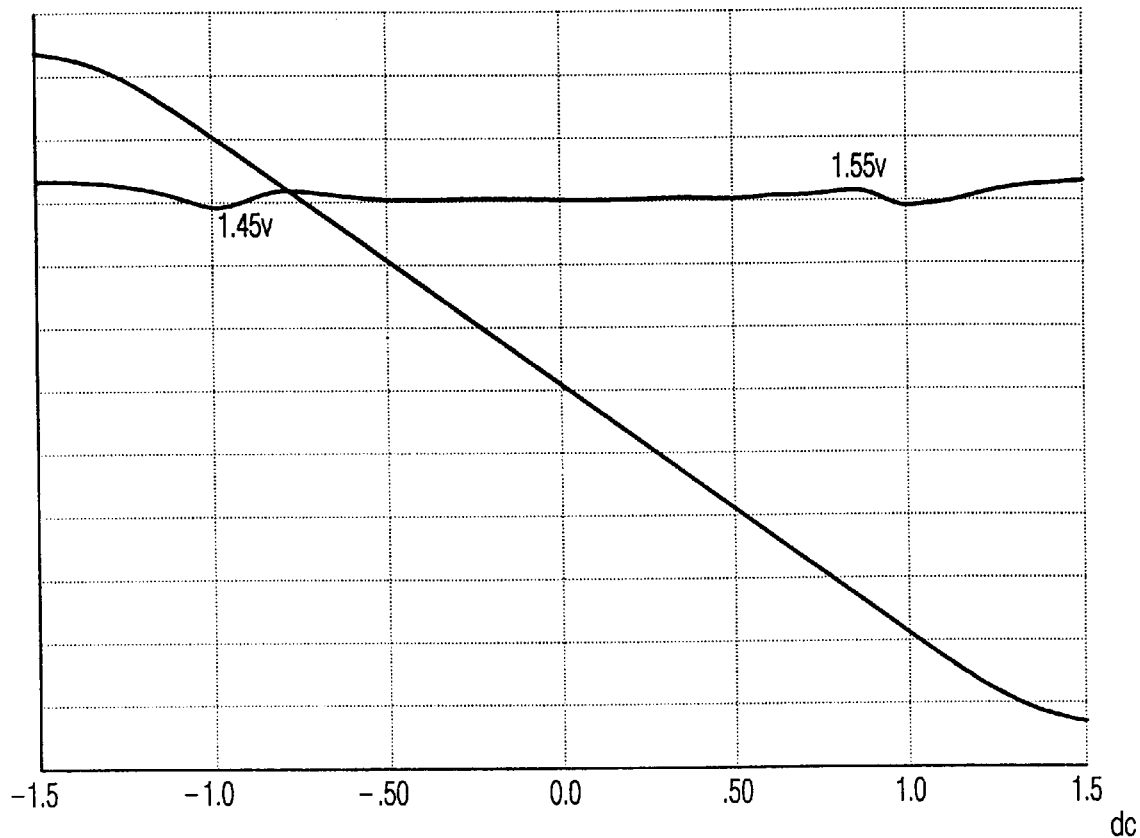
FIG. 8 shows the result of a simulation of the circuit of FIG. 7.

FIG. 8 shows the result of a simulation of the circuit of FIG. 7. It is seen that the dependence of the common potential on the differential output voltage is reduced.

Figure 9:
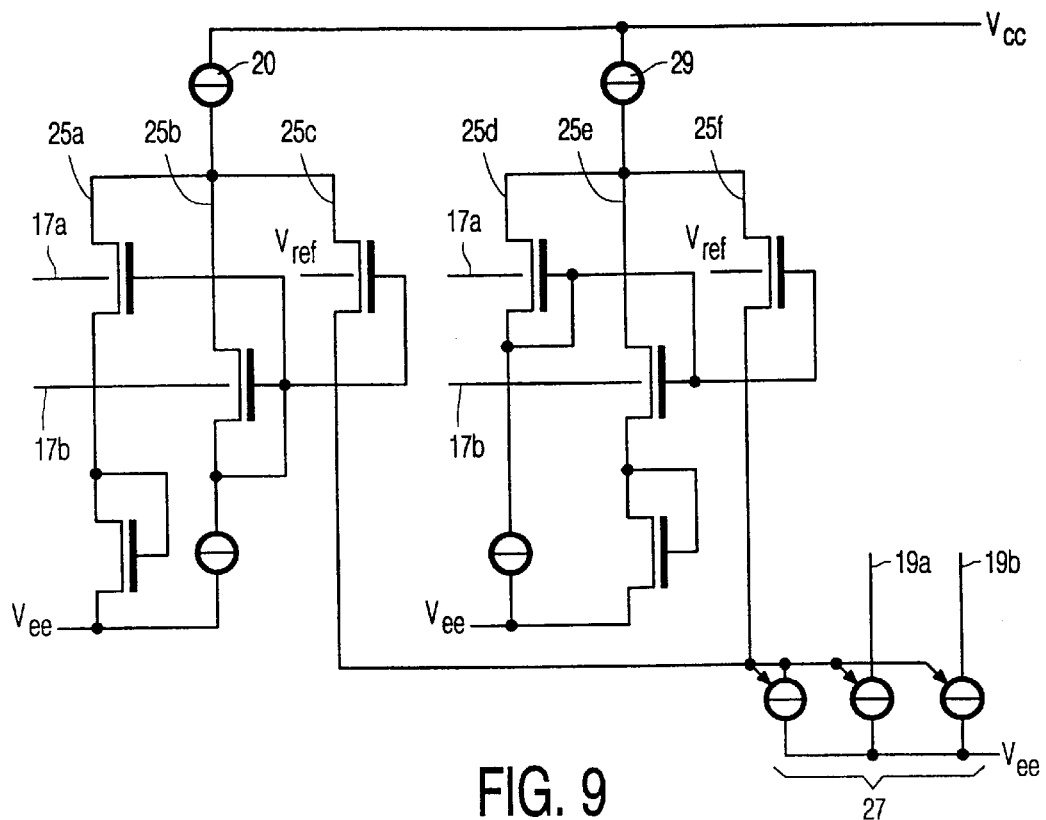
FIG. 9 shows a further embodiment of the common mode feedback circuit.

FIG. 9 shows a further embodiment of the common mode feedback circuit 18. This circuit 18 contains two sets of current branches 25*a–c*, 25*d–f*, each with its own common current source 20, 29. Outputs of the sets of current branches are connected together to a controlled current mirror 27, which reflects the sum of the currents through the output branches to the controlled current outputs 19*a,b*.

The current branches 25*a–f* are arranged in each set as a current mirror, which reflects the current drawn by one branch 25*b,e* into the other two branches 25*a,c,d,f* of the set. The degree of equality of the reflection is influenced by the potential of the connections 17*a,b* of the differential output. For this purpose, the first set contains a first branch 21*a* with a mirror transistor 210*a* having a back-gate connected to a first one of the connections 17*a* of the differential output. In the second set a first branch 21*d* has a mirror transistor 210*d* with a back-gate connected to a second one of the connections 17*b* of the differential output.

A third branch 21*c* of the first and second set has a mirror transistor 210*c* with a back-gate connected to a reference potential. The output of these third branches is connected to input of the controlled current mirror 27.

In operation, the common current sources 20, 29 both supply a current 3I. The input branch of the current mirror in each set of current branches draws a current I. When the potential of the connection 17*a,b* of the differential output equals the reference potential, the first and third branch 21*a,c,d,f* in both sets 21 *a–c*, 21 *d–f* draw equal currents I and the controllable current source outputs 19*a,b* reflect a current 2I.

When a potential of a connection 17*a,b* of the differential output deviate from the reference potential, this will induce an unequal current distribution between the first and third branch 21*a,c,d,f* of the set of branches 21*a–c*, 21 *d–f* in which that connection 17*a,b* is connected to a back gate. As a result, the third branches 21*c,f* will draw currents I+Y1 and I+Y2 where Y1 and Y2 are deviation currents proportional to the difference between the reference potential and the potential of respective ones of the connections 17*a,b* of the differential output. As a result, a current 2I+Y1+Y2 is reflected to the controllable current source outputs 19*a,b* and the net common mode current at the differential output is Y1+Y2. The sum Y1+Y2, is proportional to the difference between the common mode potential and the reference potential; this sum is substantially independent of the differential output voltage.

Figure 10:
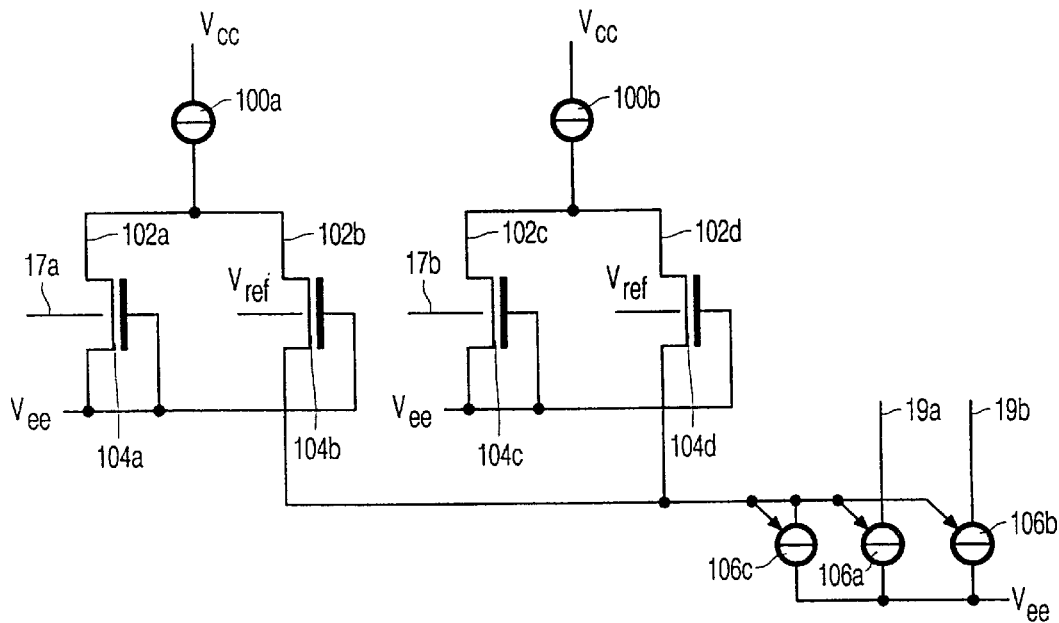
FIG. 10 shows another embodiment of the common mode feedback circuit.

FIG. 10 shows another embodiment of the common mode feedback circuit 18. This common mode feedback circuit contains two sets 102*a,b*, 102*c,d* of two current branches, a reference branch and a sense branch. Each set has its own common current source 100*a,b* coupled to a supply node Vee via the two branches 102*a–d* in parallel. Each current branch contains the channel of a PMOS transistor 104*a–d*. The gates of the PMOS transistors 104*a–d* are connected to the supply connection Vee.

The backgate of the PMOS transistors 104a,c in the sense branches of the respective sets are connected to the respective ones of the connections 17*a,b* of the differential output. The backgates of the PMOS transistors 104*b,d* in the reference branches are connected to a reference potential Vref.

The circuit contains a first, second and third controllable current sources 106*a–c*. The first and second controllable current source 106*a,b* are connected to respective ones of the outputs 19*a,b* of the common mode feedback circuit 18. The third current source 106*c* is connected between the channels of the PMOS transistor 104*b,d* in the reference branches and the supply connection Vee. The control inputs of the controllable current sources 106*a–c* are connected to each other and to a node between the third controllable current source 106c and the channels of the PMOS transistors 104*b,d* in the reference branches.

In operation, the common current sources 100*a,b* supply a fixed current 2I and the reference branches draw variable currents which will be called Y1 and Y2 respectively. The controllable current sources 106a–c draw a current equal to the sum Y1+Y2 of the currents through the reference current branches. The net common mode current at the connections to the differential outputs is 4I-2*(Y1+Y2). The common mode feedback circuit 18 will regulate this net common mode current to zero, i.e. it will adjust the current until the potential of the backgates of the PMOS transistors 104a,c so that Y1+Y2 is equal to I. For zero differential output voltage Y1=Y2 and Y1+Y2=2I. This occurs when the potential of the connections 17a,b of the differential output is equal to Vref. For non-zero differential output voltage, this remains approximately true when the sum of these potentials remains equal to Vref.

In conclusion, throughout FIGS. 1 to 10, the potentials of the connections 17a,b of the differential outputs control the currents through the transistors to whose backgates they are connected. These currents determine the common mode current feedback to the differential output. Generally speaking, the feedback circuit responds to variations in the sum of these currents by applying proportional variations in the common mode current supplied to the connections of the differential output. Thus, the feedback circuit regulates the common mode output potential. By using the backgates to sense the common mode output potential, the circuit works over a wide potential range.

What is claimed is:

1. A device comprising
a functional circuit with connections for a differential output and a common mode adjustment input for adjusting a common mode signal at the differential output,
a common mode feedback circuit coupled between the differential output and the common mode adjustment input,
the common mode feedback circuit comprising IGFETs, each having a channel and a backgate, each connection of the differential output being coupled to the backgate of a respective one of the IGFETS so as to have an influence on a current through the channel, a sum of said influences determining a feedback to the common mode control input.

2. A device as claimed in claim 1, having a power supply connection for supplying power to the circuit, the IGFETs having a gate electrode connected to the power supply connection for pulling the IGFET in a conductive state, whereby the gate carries substantially a potential of the power supply connection.

3. A device as claimed in claim 1, comprising a circuit for forming a sum current by summing the currents through the channels of the IGFETS and for using the sum current to control an output current supplied to the common mode adjustment input.

4. A device as claimed in claim 3, wherein the common mode feedback circuit has at least two common mode adjustment current source outputs coupled to respective ones of the connections of the differential output, for supplying substantially identical output currents to each of the common mode adjustment outputs in dependence on the sum current through the channels of the IGFETS.

5. A device as claimed in claim 1, comprising further IGFETs, each connection of the differential output being coupled to the backgate of a respective one of the further IGFETs so as to have a further influence on the current through the channels of the further IGFETs, a further sum of said further influences co-determining the feedback together with the sum of said influences, the sum of the influences and the further sum of the influences having a dependence on the differential voltage at the differential output with an opposite sign, whereby said dependences on a differential voltage at the differential output at least partially compensate one another.

6. A device as claimed in claim 1 where the functional circuit is an differential input-output op-amp circuit.

7. A device as claimed in claim 3 where the functional circuit is an differential input-output op-amp circuit.

* * * * *